United States Patent
Kapusta

(10) Patent No.: US 7,482,872 B2
(45) Date of Patent: Jan. 27, 2009

(54) METHODS AND APPARATUS FOR PROCESS INVARIANT TRANSCONDUCTANCE

(75) Inventor: Ronald A. Kapusta, Waltham, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/656,214

(22) Filed: Jan. 22, 2007

(65) Prior Publication Data
US 2007/0200627 A1    Aug. 30, 2007

Related U.S. Application Data

(60) Provisional application No. 60/760,780, filed on Jan. 20, 2006.

(51) Int. Cl.
*H03F 3/45* (2006.01)
(52) U.S. Cl. .................... 330/253; 330/261
(58) Field of Classification Search ............. 330/261, 330/256, 289, 296
See application file for complete search history.

(56) References Cited

U.S. PATENT DOCUMENTS 5,394,112 A * 2/1995 Alini et al. .................. 330/256

OTHER PUBLICATIONS

Chen, J. and Shi, B., "Novel Constant Transconductance References and the Comparisons with the Traditional Approach," 2003 Symposium on Mixed-Signal Design, pp. 104-107.
Pavan, S., "A Fixed Transconductance Bias Technique for CMOS Analog Integrated Circuits," 2004 Proc. of Int. Symposium on Circuits and Systems, pp. 661-664.

* cited by examiner

*Primary Examiner*—Robert Pascal
*Assistant Examiner*—Hieu P Nguyen
(74) *Attorney, Agent, or Firm*—Wolf, Greenfield & Sacks, P.C.

(57) ABSTRACT

In one aspect, a resistor process invariant transconductor is provided. The transconductor comprises a voltage input configured to receive at least one voltage signal, a current output configured to provide at least one current signal, wherein a ratio between the at least one voltage signal and the least one current signal forms a total transconductance for the transconductor, and a circuit including at least one integrated resistor connected between the voltage input and the current output, the circuit adapted to maintain the total transconductance substantially constant across variation of the at least one integrated resistor.

28 Claims, 4 Drawing Sheets

US 7,482,872 B2

METHODS AND APPARATUS FOR PROCESS INVARIANT TRANSCONDUCTANCE

RELATED APPLICATION

This application claims priority under 35 U.S.C. § 119(e) to U.S. Provisional Application Ser. No. 60/760,780, entitled "METHODS AND APPARATUS FOR PROCESS INVARIANT TRANSCONDUCTANCE," filed on Jan. 20, 2006, which is herein incorporated by reference in its entirety.

FIELD OF INVENTION

The present invention relates to integrated circuits, and more particularly, to obtaining a transconductance within an integrated circuit that is substantially constant across a desired set of operating parameters.

BACKGROUND

Transconductance is often an important measure of the performance of an electronic circuit, affecting many performance parameters including, but not limited to, bandwidth, gain and noise. Transconductance is an expression of the performance of certain electronic circuits, and traditionally refers to the ratio of output current to input voltage of a particular circuit, or mutual conductance. The term "transconductance" refers to herein as the control of an output current as a result of an input voltage, and is given by the expression:

$$g_m = \frac{\Delta I_{out}}{\Delta V_{in}}, \quad (1)$$

or more generally as, $$g_m = \frac{I_{out}}{V_{in}}, \quad (2)$$

where $g_m$ is the transconductance with units of siemens, $I_{out}$ is the output current and $V_{in}$ is the input voltage. In general, the larger the transconductance figure for a device or circuit, the greater the gain (amplification) it is capable of delivering, when all other factors are held constant.

In integrated circuits, it may be important for the transconductance of an electronic circuit to remain constant over one or more operating parameters as well as processing variation. The stability or robustness of transconductance of transistors may be an important design parameter, as it may be affected by many operation and processing conditions, such as temperature, carrier mobility, supply voltage, etc. A conventional solution to the problem of achieving constant transconductance is to use the conductance of a stable and precise external (e.g., off-chip) resistor. In the context of an amplifier, for example, a constant reference voltage provided off-chip may be placed across an external resistor to achieve a substantially constant bias current for the amplifier.

DETAILED DESCRIPTION

Figure 1:
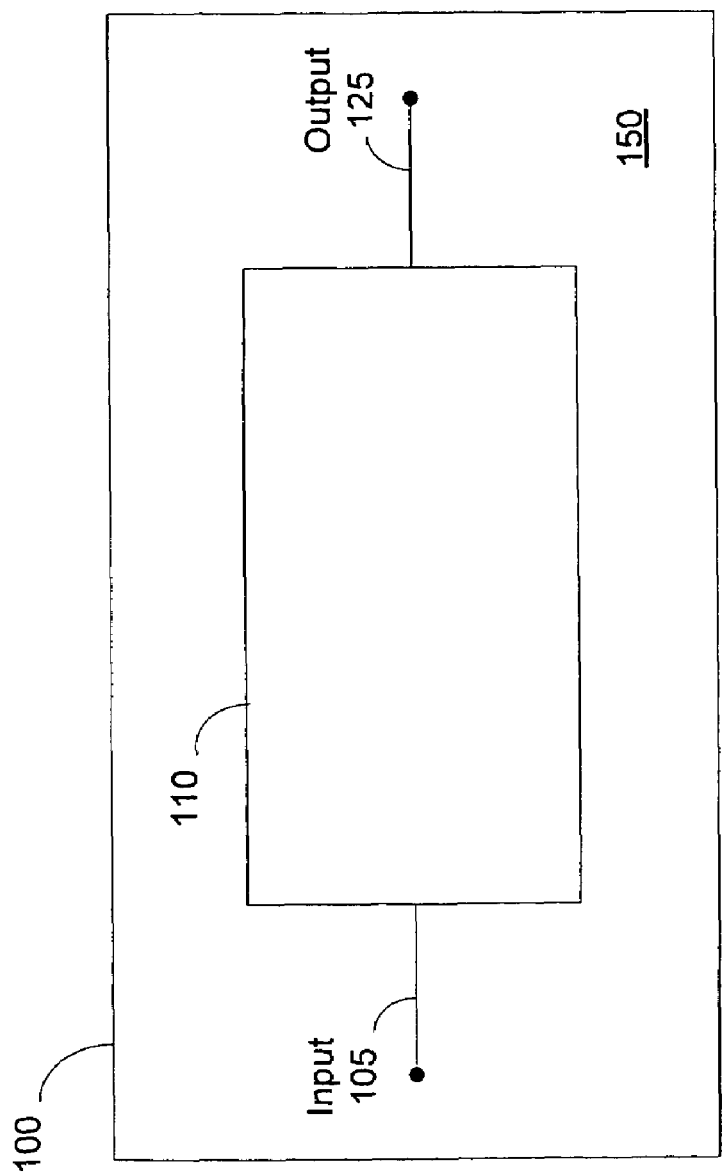
FIG. 1 illustrates a integrated amplifier having a substantially constant transconductance, in accordance with some embodiments of the present invention.

As discussed above, conventional circuits attempt to achieve a constant transconductance by forcing a constant reference voltage across a resistor to obtain a constant bias current, for example, to bias one or more amplifiers. Accordingly, the transconductance is dependent on the absolute value of the resistor. However, this solution has several problems. First, the resistor is often provided external to the integrated circuit to avoid resistor variation resulting from process conditions of the integrated circuit. Providing external components and packaging infrastructure necessary for the integrated circuit to connect to the external resistor is relatively expensive and inconvenient to manufacture.

Alternatively, the resistor can be provided internal to the integrated circuit. However, the resistor may then be vulnerable to process variation within the integrated circuit. To address this dependence, integrated circuit designers must take into consideration this variation in the resistance of the bias resistor. However, this variation may be as much as ±20%. As a result, the design of the integrated circuit must compensate for this variation. That is, the integrated circuit must be able to handle conditions where the bias resistance is 20% higher and 20% lower than an expected or nominal value. This additional design overhead is relatively expensive, increases power requirements, and complicates the design of the integrated circuit. Integrated resistors may be trimmed during manufacture to achieve low variation, but the extra processing required for resistor trimming is relatively expensive and inconvenient.

Applicant has appreciated the benefit of an integrated amplifier with a transconductance that is substantially independent of variation within the integrated circuit. Applicant has recognized that an integrated amplifier may be appropriately designed such that the transconductance may not substantially vary and/or depend on resistor process variation of the integrated circuit, nor substantially vary and/or depend on resistor variation due to operating conditions. In some embodiments, a fully integrated transconductance amplifier that is substantially constant across resistor process variation and operating conditions is provided. A transconductance that is independent of resistor process variation and operating conditions may allow for more optimal performance, such as low power for a given bandwidth, without the need for trimming or external components.

Following below are more detailed descriptions of various concepts related to, and embodiments of, methods and apparatus according to the present invention. It should be appreciated that various aspects of the invention described herein may be implemented in any of numerous ways. Examples of specific implementations are provided herein for illustrative purposes only. In addition, the various aspects of the invention described in the embodiments below may be used alone or in any combination, and are not limited to the combinations explicitly described herein.

FIG. 1 illustrates an integrated amplifier, in accordance with some embodiments of the present invention. Amplifier 100 may be fully formed in on a single substrate 150. In particular, amplifier 100 may be fully integrated such that it does not rely on connections to external resistors to provide a substantially constant transconductance. Amplifier 100 includes a voltage input 105 adapted to receive one or more voltage signals, and current output 125 adapted to provide one or more current signals. The ratio between the at least one voltage signal and the at least one current signal form the transconductance of the amplifier 100.

Amplifier 100 includes a circuit 110 adapted to maintain a substantially constant transconductance over resistor process variation. For example, circuit 110 may include one or more integrated resistor used to establish a bias current to bias components of the amplifier. Circuit 110 may be configured to ensure that the transconductance is substantially constant and independent of variation in the one or more integrated resistors, for example, due to temperature changes within the amplifier. Various methods of configuring circuit 110 are discussed in further detail below.

In FIG. 1, amplifier 100 is described as an operational transconductance amplifier (OTA), because it provides an output current in response to an input voltage. It should be appreciated, however, that the aspects of the invention are not limited to OTAs, and may be used with any amplifier circuit. For example, an operational amplifier (op-amp) can be considered an OTA with a voltage buffer at the output. In an amplifier, there is generally at least one transconductance element, and some embodiments of the invention are directed to providing at least one transconductance that is substantially independent of variation in one or more integrated resistors (e.g., one or more resistors included in the amplifier, one or more resistors used to establish a bias current, or both).

Figure 2:
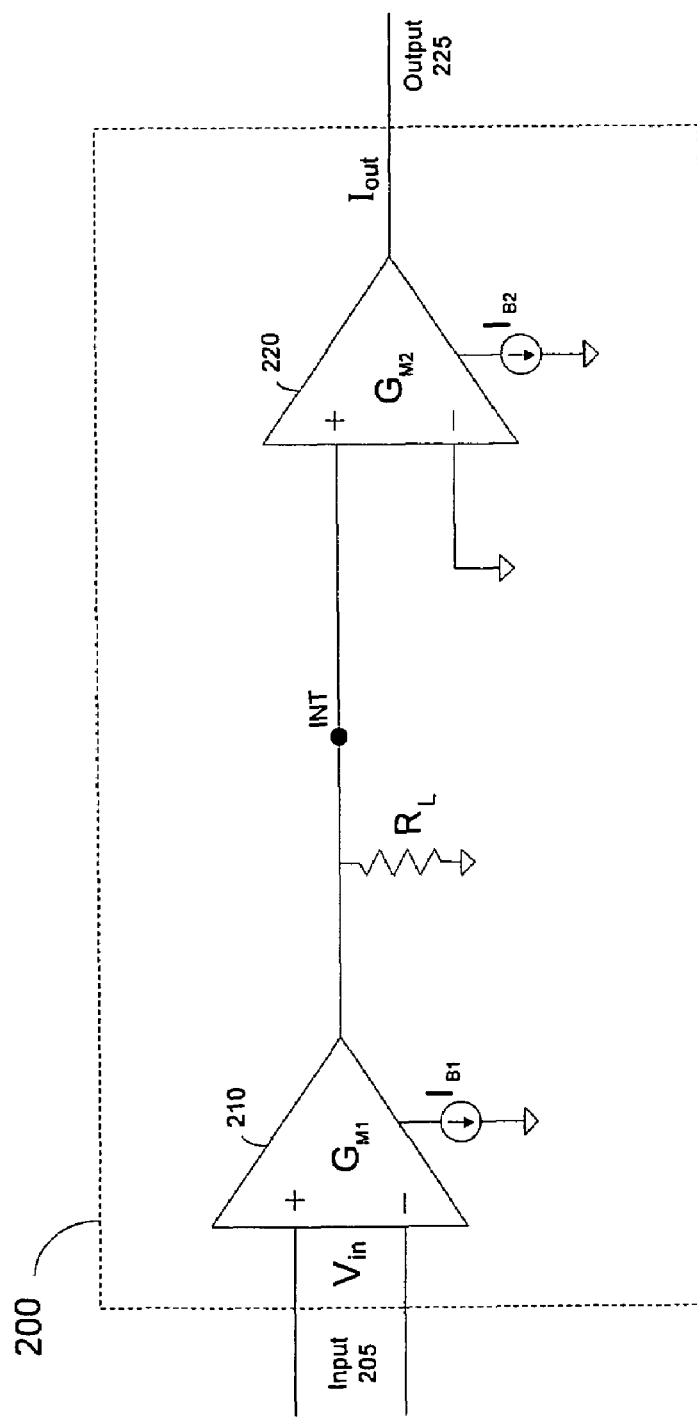
FIG. 2 illustrates an integrated circuit having a substantially constant transconductance across resistance variation, in accordance with some embodiments of the present invention.

FIG. 2 illustrates a resistor invariant amplifier, in accordance with some embodiments of the present invention. Amplifier 200 includes a first transconductance stage 210 having a transconductance of $G_{M1}$ and a second transconductance stage 220 having a transconductance $G_{M2}$, two bias currents for the two transconductance stages, $I_{B1}$ and $I_{B2}$, respectively, and a resistor $R_L$. $G_{M\_TOTAL}$, the total transconductance of amplifier 200, is equal to $I_{out}/V_{in}$ and is configured to be substantially independent of resistor variation.

Since $G_{M1}$ has ideally infinite output impedance, the current output by $G_{M1}$ will flow into the resistor $R_L$, producing some voltage gain from the input 205 to node INT. Accordingly, integrated resistor $R_L$ is arranged in the signal path of the amplifier. The voltage gain will be $G_{M1}R_L$. The voltage swing at INT will cause $G_{M2}$ to output current, and the total transconductance (defined as the current at output 225 caused by the voltage at input 205) can be expressed as, $$G_{M\_TOTAL} = G_{M1} R_L G_{M2} \quad (3).$$

Transconductances $G_{M1}$ and $G_{M2}$ are proportional to some power of the bias currents $I_{B1}$ and $I_{B2}$. For example, if the transconductors were MOSFET devices in strong inversion, the transconductances would be proportional to the square root of the bias current. If the transconductors were bipolar transistors, the transconductances would be directly proportional to the bias current. In general, the relationship between the two transconductances and the respective bias current can be expressed as a proportionality based on some factor K, which is a function of the transistor type, circuit topology, and operating conditions used to implement the two transconductance stages. For example, the proportionality described above is shown below in Equations 4 and 5 below using constants $K_1$ and $K_2$ as power factors for the respective proportionalities.

$$G_{M1} \propto I_{B1}^{K_1} \quad (4)$$

$$G_{M2} \propto I_{B2}^{K_2} \quad (5)$$

The bias currents $I_{B1}$ and $I_{B2}$ may be generated in a way such that they are also proportional to some power of the resistance $R_L$. In general, the relationship between the two bias currents $I_{B1}$ and $I_{B2}$ and the resistance can be expressed as a proportionality based on factors $H_1$ and $H_2$, respectively. This relationship is expressed in Equations 6 and 7, as $$I_{B1} \propto R_L^{H_1} \quad (6)$$

$$I_{B2} \propto R_L^{H_2} \quad (7).$$

By combining Equations 3 through 7, the relationship between the total transconductance and the resistance $R_L$ can be expressed as, $$G_{M\_TOTAL} \propto R_L^{K_1 H_1 + K_2 H_2 + 1} \quad (8).$$

Applicant has appreciated that the total transconductance can be made independent of the resistance if the exponent is designed to be zero. That is, if $$H_1 K_1 + H_2 K_2 + 1 = 0 \quad (9),$$

then the total transconductance, $G_{M\_TOTAL}$, will be constant across resistor variation, e.g., the total transconductance can be made to be independent of variations in the resistance $R_L$. As a result, as the integrated resistance (e.g., resistance $R_L$) varies or fluctuates as a result of processing or operating conditions within the integrated circuit (e.g., temperature change, etc.), the total transconductance $G_{M\_TOTAL}$ remains substantially constant. Accordingly, the expense and inconvenience of an external resistor and/or trimming one or more resistors during manufacture may be eliminated while avoiding transconductance variation resulting from resistor variation. It should be appreciated that while $G_{M\_TOTAL}$ shown in FIG. 2 is illustrated as a differential input 205, and a single-ended output 225, the aspects of the invention are not limited in this respect and can be implemented in any suitable manner. For example, the input may be single-ended and the output differential, or both the input and output may be either differential or single-ended.

Figure 3:
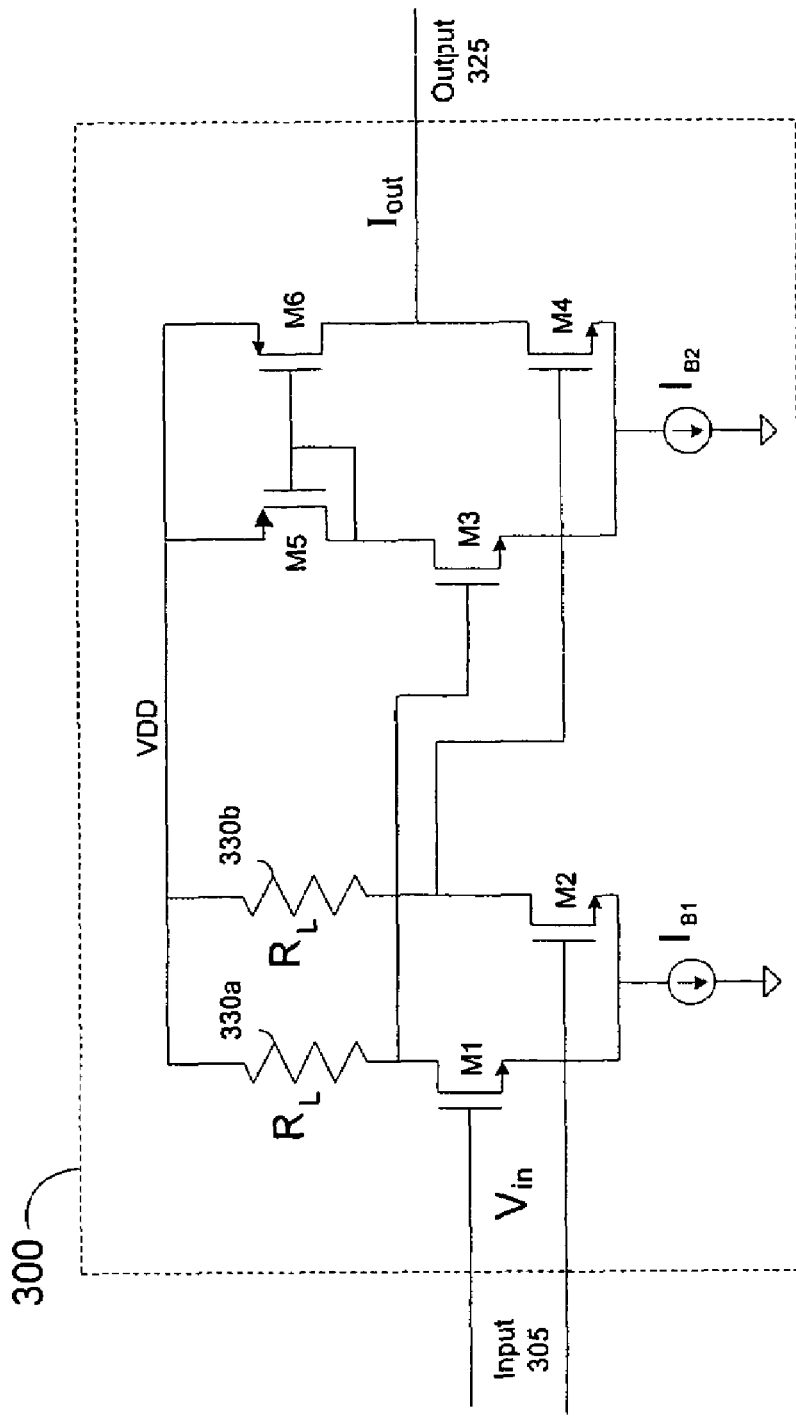
FIG. 3 illustrates an integrated circuit having a substantially constant transconductance across resistance variation implemented using transistors, in accordance with some embodiments of the present invention.

FIG. 3 illustrates an integrated circuit having a transconductance substantially invariant to resistor variation, in accordance with some embodiments of the present invention. In FIG. 3, transconductors $G_{M1}$ and $G_{M2}$ illustrated in FIG. 2 are implemented as NMOS devices. The first stage transconductor, comprised of M1 and M2, has a differential output connected to the load resistors $R_L$. The second stage transconductor, comprised of M3 and M4, is loaded with a current mirror, comprised of M5 and M6. In some embodiments, the transconductors are formed from MOSFETs biased so as to operate in strong inversion. As a result, the transconductances $G_{M1}$ and $G_{M2}$ will be proportional to the square root of the bias currents. That is power factors $K_1$ and $K_2$ introduced in equations 4 and 5 may be chosen as, $$K_1 = K_2 = 0.5 \quad (10).$$

In order to satisfy equation 7 given $K_1$ and $K_2$ shown in equation 9, the sum of factors $H_1$ and $H_2$ should be equal to −2. If the bias currents $I_{B1}$ and $I_{B2}$ are generated from the same current reference circuit, the factors $H_1$ and $H_2$ may be established to be the same. In this case, Equations 9 and 10 are both satisfied for the relationship, $$H_1 = H_2 = -1 \quad (11).$$

Equation 11 illustrates that if both bias currents are inversely proportional to the resistance $R_L$, then Equation 9 will be satisfied and the total transconductance $G_{M\_CONSTANT}$ will be substantially constant across resistor variations. Providing a substantially constant transconductance may be achieved using other suitable integrated circuits, as the aspects of the invention are not limited for use with any particular implementation.

Figure 4:
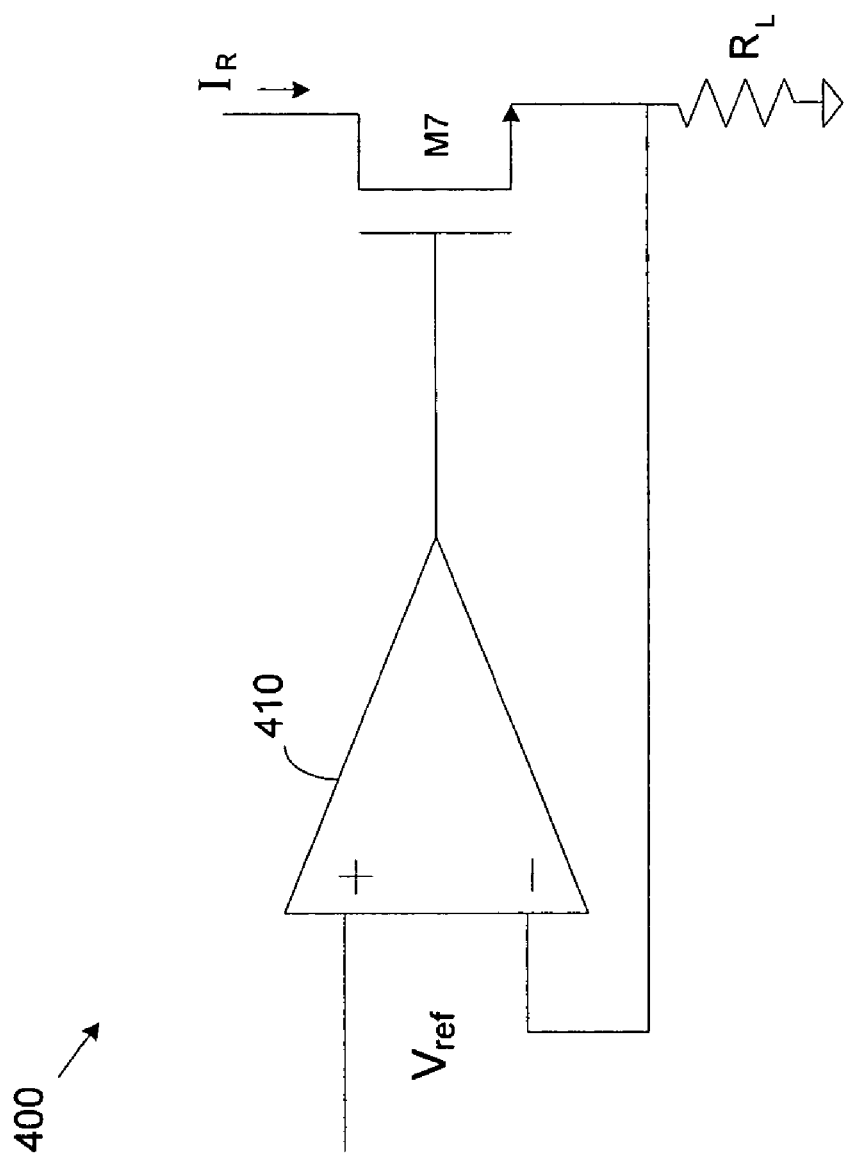
FIG. 4 illustrates a circuit for implementing one or more of the bias currents for a transconductor, in accordance with some embodiments of the present invention.

FIG. 4 illustrates a circuit suitable for generating bias currents inversely proportional to resistance, that can be used to implement a transconductor in accordance with some embodiments of the present invention. Circuit 400 benefits from a substantially stable reference voltage $V_{ref}$ as an input. This reference voltage may be constant across resistor processing variations, such as a bandgap voltage. Amplifier 410 forces this voltage to appear at the source of M7, across $R_L$. Accordingly, resistor $R_L$ appears in the bias current signal path of circuit 400. Assuming infinite amplifier gain, the current that will flow through the drain of M7 can be expressed as, $$I_R = \frac{V_{ref}}{R_L}. \tag{12}$$

Circuit 400 may be used to implement bias currents $I_{b1}$, and/or $I_{b2}$ in FIGS. 2 and 3. However, the bias currents may be implemented in other ways as the aspects of the invention are not limited in this respect. It should be appreciated that RL in FIG. 4 need not be the same resistor as the load resistors illustrated in FIGS. 2 and 3. However, utilizing the same type of resistor may yield a transconductance with superior independence from resistor process variation.

As should be appreciated from the foregoing, there are numerous aspects of the present invention described herein that can be used independently of one another or in any combination. In particular, various aspects of the present invention may be used alone, in combination, or in a variety of arrangements not specifically discussed in the embodiments described in the foregoing, and the aspects of the present invention described herein are not limited in their application to the details and arrangements of components set forth in the foregoing description or illustrated in the drawings. The aspects of the invention are capable of other embodiments and of being practiced or of being carried out in various ways. Various aspects of the present invention may be implemented using any type of circuit and no limitations are placed on the circuit implementation. A Accordingly, the foregoing description and drawings are by way of example only.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

What is claimed is:

1. An amplifier comprising:
    a voltage input configured to receive at least one voltage signal;
    a current output configured to provide at least one current signal, wherein a ratio between the at least one voltage signal and the least one current signal forms a total transconductance for the amplifier;
    a circuit including at least one first integrated resistor connected in an amplifier signal path, the circuit adapted to maintain the total transconductance substantially constant across variation of the at least one first integrated resistor; and
    at least one amplifier circuit connected between the voltage input and the current output, the at least one amplifier circuit including a bias current circuit having at least one second integrated resistor connected to establish, at least in part, at least one bias current for the amplifier, and wherein the circuit is adapted to maintain the total transconductance substantially constant across variation of the at least one second integrated resistor;
    wherein the at least one amplifier circuit includes a first amplifier circuit having at least one input connected to the voltage input, and a second amplifier circuit having at least one input connected to an output of the first amplifier circuit.

2. The amplifier of claim 1, wherein an output of the second amplifier circuit forms, at least in part, the current output.

3. The amplifier of claim 2, wherein the first amplifier circuit is biased by a first bias current, and the second amplifier circuit is biased by a second bias current, and wherein the first bias current and the second bias current depend, at least in part, on the at least one second integrated resistor.

4. The amplifier of claim 1, wherein the at least one first integrated resistor is connected between the first amplifier circuit and the second amplifier circuit.

5. An amplifier comprising:
    a voltage input configured to receive at least one voltage signal;
    a current output configured to provide at least one current signal, wherein a ratio between the at least one voltage signal and the least one current signal forms a total transconductance for the amplifier;
    a circuit including at least one first integrated resistor connected in an amplifier signal path, the circuit adapted to maintain the total transconductance substantially constant across variation of the at least one first integrated resistor; and
    a first stage transconductor having a first stage transconductance and a second stage transconductor having a second stage transconductance.

6. The amplifier of claim 5, wherein the total transconductance is a function of the first stage transconductance, the second stage transconductance and the at least one first integrated resistor.

7. The amplifier of claim 6, wherein the first stage transconductor is biased by at least one first bias current, and the second stage transconductor is biased by at least one second bias current.

8. The amplifier of claim 7, wherein the first stage transconductance is proportional to a power $K_1$ of the at least one first bias current, the second stage transconductance is proportional to a power $K_2$ of the at least one second bias current, the at least one first bias current is proportional to a power $H_1$ of the at least one first integrated resistor, and the at least one second bias current is proportional to a power $H_2$ of the at least one first integrated resistor.

9. The amplifier of claim 8, wherein the total transconductance is proportional to a power $P_1$ of the at least one first integrated resistor, $P_1$ being a function of $K_1$, $K_2$, $H_1$ and $H_2$, and wherein $K_1$, $K_2$, $H_1$ and $H_2$ are selected such that $P_1$ is equal to zero such that the total transconductance is substantially invariant to changes in the at least one first integrated resistor.

10. The transconductor of claim 6, wherein the first stage transconductor comprises at least one MOSFET device biased by the at least one first bias current to operate the at least one MOSFET device in strong inversion.

11. The transconductor of claim 10, wherein the second stage transconductor comprises at least one MOSFET device biased by the at least one second bias current to operate the at least one MOSFET device in a strong inversion region.

12. The amplifier of claim 1, wherein the amplifier does not rely on an external resistor or resistor trimming.

13. An amplifier comprising:
a voltage input configured to receive at least one voltage signal;
a current output configured to provide at least one current signal, wherein a ratio between the at least one voltage signal and the least one current signal forms a total transconductance for the amplifier; and
a circuit including at least one amplifier circuit, the at least one amplifier circuit including a bias current circuit having at least one first integrated resistor connected to establish, at least in part, at least one bias current for the amplifier, and wherein the circuit is adapted to maintain the total transconductance substantially constant across variation of the at least one first integrated resistor;
wherein the at least one amplifier circuit includes a first amplifier circuit having at least one input connected to the voltage input, and a second amplifier circuit having at least one input connected to an output of the first amplifier.

14. The amplifier of claim 13, wherein the circuit includes at least one second integrated resistor connected in an amplifier signal path, the circuit adapted to maintain the total transconductance substantially constant across variation of the at least one second integrated resistor.

15. The amplifier of claim 13, wherein an output of the second amplifier circuit forms, at least in part, the current output.

16. The amplifier of claim 15, wherein the first amplifier circuit is biased by a first bias current, and the second amplifier circuit is biased by a second bias current, and wherein the first bias current and the second bias current depend, at least in part, on the at least one first integrated resistor.

17. The amplifier of claim 13, wherein the at least one second integrated resistor is connected between the first amplifier circuit and the second amplifier circuit.

18. The amplifier of claim 14, further comprising a first stage transconductor having a first stage transconductance and a second stage transconductor having a second stage transconductance.

19. The amplifier of claim 18, wherein the total transconductance is a function of the first stage transconductance, the second stage transconductance and the at least one second integrated resistor.

20. The amplifier of claim 19, wherein the first stage transconductor is biased by at least one first bias current, and the second stage transconductor is biased by at least one second bias current.

21. The amplifier of claim 20, wherein the first stage transconductance is proportional to a power $K_1$ of the at least one first bias current, the second stage transconductance is proportional to a power $K_2$ of the at least one second bias current, the at least one first bias current is proportional to a power $H_1$ of the at least one integrated resistor, and the at least one second bias current is proportional to a power $H_2$ of the at least one second integrated resistor.

22. The amplifier of claim 21, wherein the total transconductance is proportional to a power $P_1$ of the at least one second integrated resistor, $P_1$ being a function of $K_1$, $K_2$, $H_1$ and $H_2$, and wherein $K_1$, $K_2$, $H_1$ and $H_2$ are selected such that $P_1$ is equal to zero such that the total transconductance is substantially invariant to changes in the at least one second integrated resistor.

23. The transconductor of claim 22, wherein the first stage transconductor comprises at least one MOSFET device biased by the at least one first bias current to operate the at least one MOSFET device in strong inversion.

24. The transconductor of claim 23, wherein the second stage transconductor comprises at least one MOSFET device biased by the at least one second bias current to operate the at least one MOSFET device in a strong inversion region.

25. The amplifier of claim 13, wherein the amplifier does not rely on an external resistor or resistor trimming.

26. A method of providing a substantially constant total transconductance in an integrated amplifier, the method comprising:
providing a first stage transconductance proportional to a power $K_1$ of a first bias current;
providing a second stage transconductance proportional to a power $K_2$ of a second bias current;
providing the first bias current proportional to a power $H_1$ of at least one integrated resistance;
providing the second bias current proportional to a power $H_2$ of the at least one integrated resistance;
providing the total transconductance as a function of the first stage transconductance, the second stage transconductance and the at least one integrated resistance, such that the total transconductance is proportional to a power $P_1$ of the at least one integrated resistance, the power $P_1$ being a function of $K_1$, $K_2$, $H_1$ and $H_2$; and
selecting values of $K_1$, $K_2$, $H_1$ and $H_2$ such that $P_1$ is zero such that the total transconductance is independent of variation of the at least one integrated resistance.

27. The method of claim 26, wherein the first bias current and the second bias current are the same, and $K_1$ and $K_2$ are selected to be equal.

28. The method of claim 26, wherein $H_1$ and $H_2$ are selected to be equal.

* * * * *